US012698410B2

(12) United States Patent
Trulli et al.

(10) Patent No.: US 12,698,410 B2
(45) Date of Patent: Aug. 4, 2026

(54) DIRECT WRITE DUAL CURE GASKET

(71) Applicants: Raytheon Company, Waltham, MA (US); The University of Massachusetts, Lowell, MA (US)

(72) Inventors: Susan C. Trulli, Lexington, MA (US); Yuri Piro, Boston, MA (US); Alkim Akyurtlu, Arlington, MA (US)

(73) Assignees: RAYTHEON COMPANY, Waltham, MA (US); UNIVERSITY OF MASSACHUSETTS, Lowell, MA (US)

(*) Notice: Subject to any disclaimer, the term of this patent is extended or adjusted under 35 U.S.C. 154(b) by 282 days.

(21) Appl. No.: 18/344,143

(22) Filed: Jun. 29, 2023

(65) Prior Publication Data

US 2024/0002692 A1 Jan. 4, 2024

Related U.S. Application Data

(60) Provisional application No. 63/356,731, filed on Jun. 29, 2022.

(51) Int. Cl.

| | |
|---|---|
| ***H05K 1/18*** | (2026.01) |
| ***C08G 59/32*** | (2006.01) |
| ***C08K 3/38*** | (2006.01) |
| ***C08K 7/20*** | (2006.01) |
| ***C09D 7/61*** | (2018.01) |
| ***C09D 7/63*** | (2018.01) |
| ***C09D 163/00*** | (2006.01) |
| ***H05K 1/183*** | (2026.01) |
| ***H05K 1/185*** | (2026.01) |

(52) U.S. Cl.

CPC ........... *C09D 163/00* (2013.01); *C08G 59/32* (2013.01); *C08K 3/38* (2013.01); *C08K 7/20* (2013.01); *C09D 7/61* (2018.01); *C09D 7/63* (2018.01); *H05K 1/183* (2013.01); *H05K 1/185* (2013.01); *C08K 2003/385* (2013.01); *H05K 2201/10378* (2013.01); *H05K 2201/10636* (2013.01)

(58) Field of Classification Search

CPC ............................... H05K 1/183; H05K 1/185

See application file for complete search history.

(56) References Cited

U.S. PATENT DOCUMENTS 5,773,528 A 6/1998 Alvarado et al.
2005/0026069 A1 2/2005 Yeh (Continued)

FOREIGN PATENT DOCUMENTS

JP H0413150 A 1/1992
JP 2013189504 A 9/2013
JP 2016094579 A 5/2016

(Continued)

OTHER PUBLICATIONS

Notification of Transmittal of International Preliminary Report on Patentability; PCT/US2023/026551; Dec. 18, 2024, 7 pages.

(Continued)

*Primary Examiner* — Jeremy C Norris
(74) *Attorney, Agent, or Firm* — CANTOR COLBURN LLP

(57) ABSTRACT

A composition for making a filler including a plurality of ceramic particles, an oxirane monomer in liquid form, an ultraviolet initiator that absorbs ultraviolet, and a thermal initiator.

7 Claims, 6 Drawing Sheets

(56) References Cited

U.S. PATENT DOCUMENTS

| | | | |
|---|---|---|---|
| 2019/0211140 A1 | 7/2019 | Reichvilser et al. | |
| 2022/0017777 A1* | 1/2022 | Shimizu ............... | C09D 183/06 |

FOREIGN PATENT DOCUMENTS

| | | |
|---|---|---|
| WO | 2007017307 A1 | 2/2007 |
| WO | 2012039372 A1 | 3/2012 |
| WO | 2012039379 A1 | 3/2012 |
| WO | 2012039380 A1 | 3/2012 |

OTHER PUBLICATIONS

Notification of Transmittal of the International Search Report and the Written Opinion of the International Searching Authority, or the Declaration; PCT/US2023/026551; Sep. 12, 2023, 13 pages.

Japanese Office Action for Patent Application No. 2024-575678, mailed Nov. 25, 2025, 11 pages (with English translation).

* cited by examiner

#5

#4

#3

#2

#1

DIRECT WRITE DUAL CURE GASKET

CROSS REFERENCE TO RELATED APPLICATIONS

This application claims the benefit of an earlier filing date from U.S. Provisional Application Ser. No. 63/356,731 filed Jun. 29, 2022, the entire disclosure of which is incorporated herein by reference.

BACKGROUND

The present disclosure relates to light and heat curable composite materials, and more specifically to light and heat curable composite materials for direct write semiconductor applications.

Conventional printed circuit boards have a mounted electronic component, or chip, on the surface of a bottom wiring layer. An insulation layer and top wiring layer are laminated on top of the chip, and via holes are formed for the electrical connection between the wiring layers and chip.

In response to demands for electronic devices with greater capabilities and smaller sizes, the recent technology trend is towards more densified and miniaturized electronic components. The demand is thus increasing for smaller printed circuit boards that allow high-density mounting of electronic components. Accordingly, multilayer circuit boards are being developed to provide electrical connection between wiring layers or between wiring and electrical components formed on different layers through via holes. The multilayer circuit board reduces the wiring that interconnects electronic components and provides high-density wiring, which increases the surface area of the printed circuit board, as well as provides superior electrical characteristics.

SUMMARY

According to some embodiments, a composition for making a filler including a plurality of ceramic particles, an oxirane monomer in liquid form, an ultraviolet initiator that absorbs ultraviolet, and a thermal initiator.

According to other embodiments, a chip-embedded printed circuit board includes a cavity in a printed circuit board, a chip in the cavity of the printed circuit board, and a gap filler in a gap in the cavity to seal the chip in the printed circuit board. The gap filler includes an oxirane-based polymer and ceramic particles and has a coefficient of thermal expansion of about 10 to about 150 parts per million per degrees Celsius.

Yet, according to other embodiments, a method of screening initiator combinations for curing polymers includes providing a first composition comprising an oxirane monomer in liquid form and an ultraviolet initiator. The method further includes exposing the first composition to ultraviolet light at a wavelength absorbed by the ultraviolet initiator to initiate polymerization of a first polymer, and measuring enthalpy released by the first polymer. The method also includes providing a second composition comprising an oxirane monomer in liquid form, the ultraviolet initiator, and a thermal initiator, and exposing the second composition to ultraviolet light at the wavelength absorbed by the ultraviolet initiator to initiate polymerization of a second polymer. The method includes measuring enthalpy released by the second polymer formed by the second composition, and comparing the enthalpy of the first polymer to the enthalpy of the second polymer. The method includes determining, based on the comparison, whether the UV initiator and the thermal initiator inhibit one another.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1B:
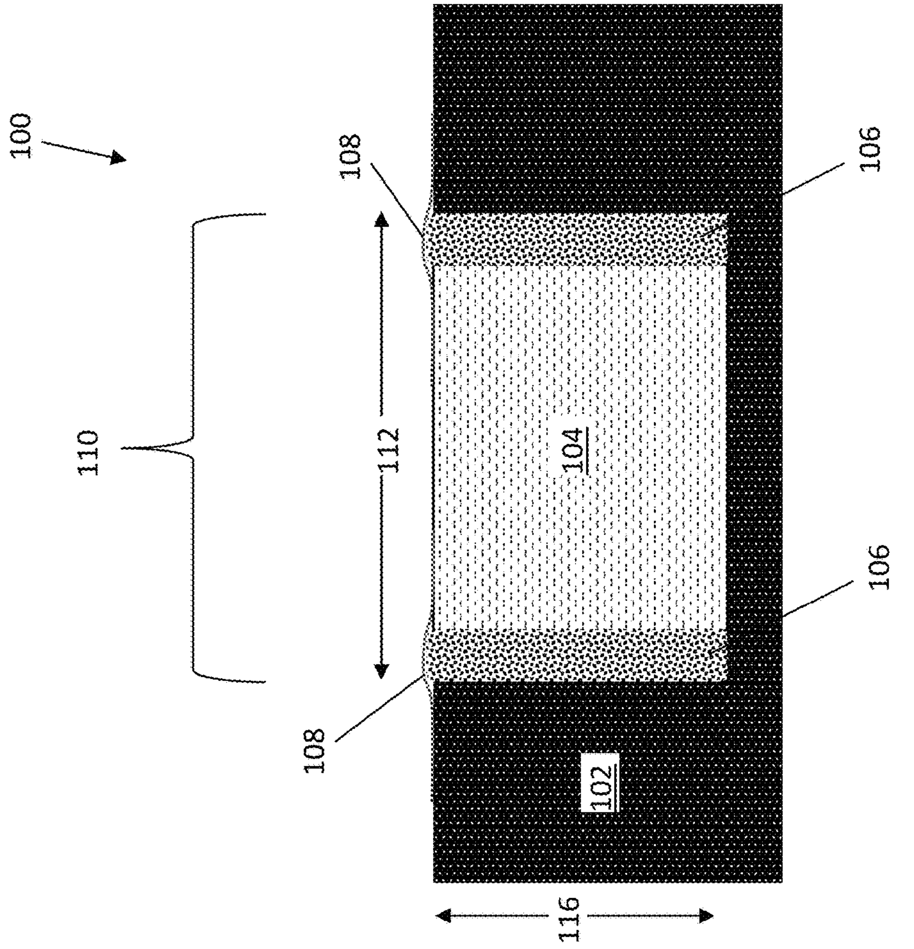
FIG. 1B is a cross-sectional side view of FIG. 1A.

As mentioned above, conventional printed circuit boards have a laminated chip mounted with solder on a surface, with metal filled vias connecting wiring layers above and below. However, creating such via holes are complicated processing steps.

Using chips embedded in a printed circuit board eliminates the via wiring and reduces processing cost and complexity. A cavity is formed in a printed circuit board, a chip is disposed in the cavity, and a material is used to fill gaps between the chip and the printed circuit board.

Norland Electronic Adhesive 121 (NEA 121) is a mercapto-ester/benzophenone composition and adhesive for tacking, filling, sealing, conformal coating, and tamper-proofing precision products. However, a drawback of NEA 121 as a gap filler for embedding a chip in a printed circuit board is that the viscosity is too low (about 300 Centipoise) and results in minimal shear thinning; the low viscosity and minimal shear thinning amount to unfavorable capillary wetting of the side walls of the junction, as well as material loss via gaps at the base of the device build. In addition, the CTE of NEA 121 can cause interconnect delamination and cracking. Creative Materials 119-48 (CM 119-48) is a screen-printable, flexible, UV-cured dielectric coating that has also been used as a gasket for similar applications. However, this material exhibits an unfavorably high viscosity (about 150,000 Centipoise), which causes the material to maintain its shape while being dispensed, leaving a rough finish that is difficult to print silver on top of.

Accordingly, described herein are gap filler compositions and methods of embedding a chip in a printed circuit board, which eliminate the via wiring and thereby reduces processing cost and device complexity. The compositions are printable by direct write applications and have thermal expansion properties analogous to the printed conductive inks used to form interconnects, which is key step in creating more robust printed structures. The compositions and materials enable printing of multi-layer printed microwave elements by improving the robustness of printed interconnects, particularly in embodiments where a gap is bridged from a chip to a printed circuit board.

The gap filler compositions include a liquid oxirane monomer, a UV initiator, and a thermal initiator, which are thereby cured by a dual cure mechanism that includes both UV light and heat. The dual cure mechanism allows the material to be initially cured with UV radiation to lock the material in place on the substrate, followed by post processing with heat to increase the degree of cure and material strength, lowering the CTE. A lower CTE is desired and prevent printed interconnect delamination, and as such, the composition further includes a thermally resistant organic matrix to suspect the inorganic particles and cause a favorable shear thinning effect. The composition is syringe dispensable, allowing for use in conventional direct write production equipment. The dual cure composition allows for a post processing step that simultaneously drives monomer conversion and provides us the lowest possible CTE. To use the composition as a gap filler, a cavity is formed in a printed circuit board, a chip is disposed in the cavity, and the direct write, dually curable (thermal and UV) composite ink is disposed in bridging gaps in the cavity between the chip and the circuit board to provide an embedded die, sealed by the printable gasket material. An interposer is disposed on the cavity to provide electrical connections to the chip.

The gap fillers described herein are formed by initially providing a composition comprising an oxirane monomer in liquid form, an ultraviolet initiator that absorbs ultraviolet light, a thermal initiator, and a plurality of ceramic particles. The monomer is in a liquid form so that additional solvent is not needed, as solvent would result in undesired shrinkage. In one or more embodiments, the compositions are free of (or do not include) solvents, or include less than 1 weight % solvent, less than 5 weight % solvent, or less than 10 weight % solvent.

The monomer is an oxirane monomer, which polymerizes through a ring-opening mechanism that imparts less strain compared to linear monomers, such as acrylates. The oxirane monomer is polymerized via cationic pathways, which are not inhibited by oxygen, and have improved stability in contrast to acrylates. In some embodiments, the compositions are free of (or do not include) acrylate monomers. In some embodiments, the compositions include less than 1 weight % of an acrylate monomer, less than 5 weight % an acrylate monomer, or less than 10 weight % of an acrylate monomer.

The monomer used in the composition has a boiling point greater than 130 degrees Celsius in some embodiments so that it does not boil off before triggering the heat curing of the monomer, which occurs at about 110 degrees Celsius. In other embodiments, the monomer has a boiling point greater than 150 degrees Celsius. Yet, in embodiments, the monomer has a boiling point of about 130 to about 300 degrees Celsius.

The monomer used in the composition further has a low viscosity, e.g., less than 17 Centipoise in some embodiments, so that high amounts of ceramic particles can be combined in the composition to lower the CTE. In other embodiments, the monomer has a viscosity less than 10, less than 5, or less than 2 Centipoise. Yet, in embodiments, the monomer has a viscosity of about 1 to about 5,000 Centipoise.

The monomer used in the composition is an oxirane monomer, which is a monomer that includes one or more oxirane structures. In some embodiments, the oxirane monomer includes two oxirane structures. In other embodiments, the oxirane monomer includes three oxirane structures. In some embodiments, the oxirane structure monomer is a symmetric compound. In other embodiments, the oxirane monomer includes one or more oxirane structures and one or more ethers. In one or more embodiments, the oxirane monomer includes two oxirane structures and two ether structures. Yet, in some embodiments, the oxirane monomer includes three oxirane structures and three ether structures. Still, in other embodiments, the oxirane monomer does not include an aromatic structure.

Non-limiting examples of the oxirane monomer include butanediol diglycidyl ether, trimethylolpropane triglycidyl ether, neopentyl glycol diglycidyl ether, tris(4-hydroxyphenyl)methane triglycidyl ether, resorcinol diglycidyl ether, bisphenol-A diglycidyl ether based resins, novolac epoxy resins, or any combination thereof.

A non-limiting example of an oxirane monomer has the following structure:

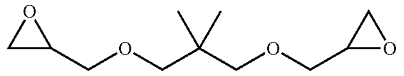

Another non-limiting example of an oxirane monomer has the following structure:

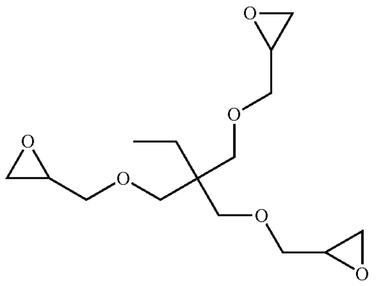 [SMILES: CCC(COCC1CO1)(COCC1CO1)COCC1CO1]

The ultraviolet initiator in the composition absorbs ultraviolet light with wavelengths of about 200 nanometers to about 400 nanometers. In one or more embodiments, the ultraviolet initiator absorbs ultraviolet light weight wavelengths of about 260 nanometers to about 360 nanometers. In some embodiments, the ultraviolet initiator is a hexafluorophosphate salt. In one or more embodiments, the ultraviolet initiator is a hexafluorophosphate salt with the following structure:

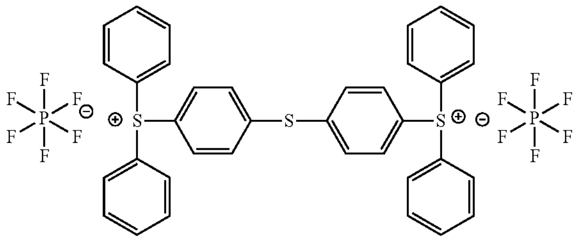

The composition further includes a thermal initiator. The thermal initiator has a thermal activation temperature greater than 110 degrees Celsius, which triggers cationic polymerization by acting as a Lewis acid and provides the ability to post-process the material with a heat treatment, further increasing the degree of cure. In one or more embodiments, the thermal activation temperature is greater than 120 or greater than 130 degrees Celsius. In one or more embodiments, the thermal initiator is a Lewis acid. A non-limiting example of a thermal initiator has the following structure:

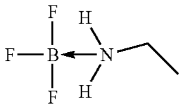

The dual cure mechanism allows the filler to cure first by ultraviolet light and then by heat. Upon ultraviolet light absorption, the ultraviolet initiator energy creates free radicals that react with the monomers to initiate polymerization and ultraviolet curing. The ultraviolet initiators enable the gap filler to cure by using ultraviolet light from an ultraviolet light source, such as a mercury lamp or light emitting diode lamp. Then, upon heat absorption, the catalyst converts to $HBF_4$, a strong Lewis acid. The proton from the Lewis acid then can be added to the oxygen atom of the oxirane monomer. This then causes a cationic polymerization between the oxonium ion and all available oxirane monomers. The composition further includes an inert inorganic filler that is a plurality of ceramic particles. In some embodiments, the ceramic particles are high aspect ratio particles, e.g., boron nitride. The high aspect ratio of the particles, in a low viscosity liquid, will align in the direction of flow when shear is applied, which causes the shear thinning effect. This shear thinning gives way to smooth, high-resolution prints. The ceramic particles are thermally conductive, opaque, and do not absorb ultraviolet light such that they do not interfere with curing by ultraviolet light.

According to one or more embodiments, the ceramic particles are hexagonal boron nitride particles. In some embodiments, the ceramic particles have an aspect ratio of about 2:1 to about 30:1. In other embodiments, the ceramic particles have an aspect ratio of about 10:1 to about 20:1. According to one or more embodiments, the ceramic particles have an average diameter of about 0.5 to about 1.2 micrometers. In other embodiments, the ceramic particles have an average diameter of about 0.8 to about 1.0 micrometers.

According to other embodiments, the ceramic particles do not have a high aspect ratio and are spherical in shape, e.g., glass spheres. In embodiments, the glass spheres have a diameter of about 0.5 to about 20 micrometers. In other embodiments, the glass spheres have a diameter of about 2 to about 10 micrometers.

In one or more embodiments, the ceramic particles are in the gap filler composition in an amount of about 10 to about 80 weight %. In other embodiments, the ceramic particles are in the gap filler composition in an amount of about 15 to about 60 weight %.

Once polymerized by ultraviolet light and heat, the resulting double cured gap filler includes a polymer matrix. In some embodiments, the polymer of the polymer matrix is an oxirane polymer. Yet, in other embodiments, the polymer matrix is a polymer formed from a butanediol diglycidyl ether, trimethylolpropane triglycidyl ether, neopentyl glycol diglycidyl ether, tris(4-hydroxyphenyl)methane triglycidyl ether, resorcinol diglycidyl ether, bisphenol-A diglycidyl ether based resins, novolac epoxy resins, or any combination thereof.

With the ceramic particles, the CTE of the composite composition can be lowered. In one or more embodiments, the CTE of the cured composition is about 10 to about 150 parts per million per degrees Celsius. In other embodiments, the CTE of the cured composition is about 40 to about 100 parts per million per degrees Celsius.

Figure 1A:
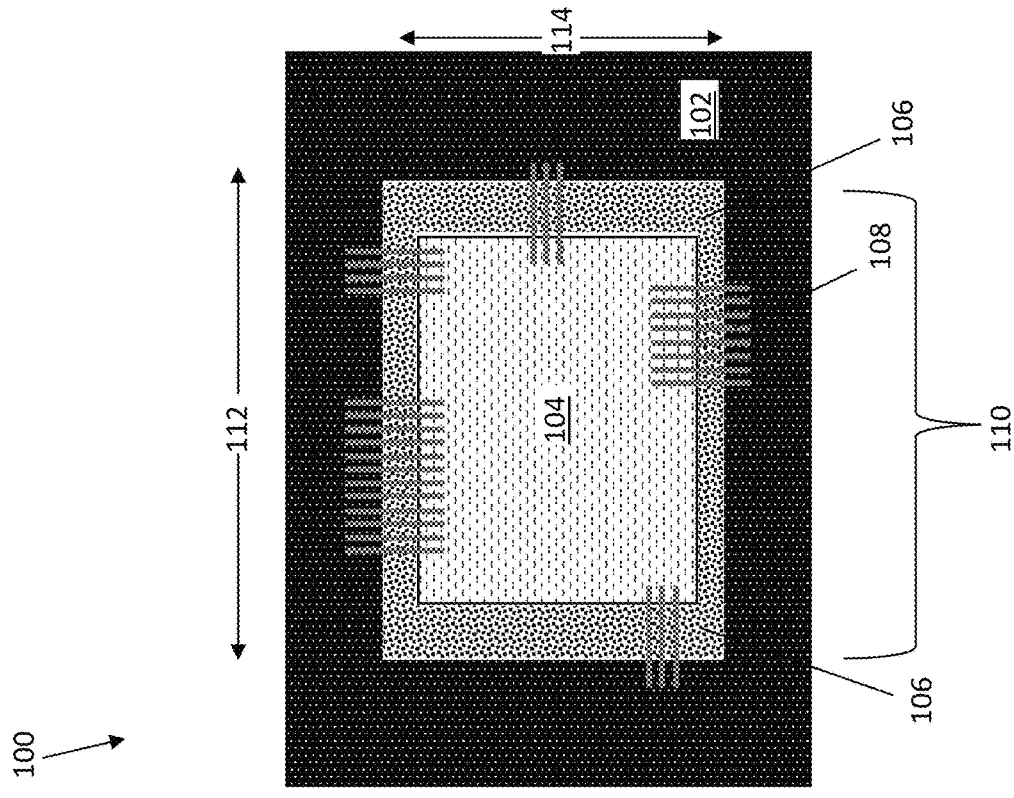
FIG. 1A is a top view of a chip embedded printed circuit board.

In embodiments, the compositions are used to form chip embedded printed circuit boards. FIG. 1A is a top view of a chip embedded printed circuit board 100. FIG. 1B is a cross-sectional side view of FIG. 1A. The chip embedded printed circuit board 100 includes substrate 102 that is the printed circuit board. The substrate 102 that is the printed circuit board is a laminated structure of conductive (such as copper) and insulating layers. The printed circuit board can be one sided (e.g., one copper layer), double-sided (two copper layers on both sides of one substrate layer), or multi-layer (outer and inner layers of copper, alternating with layers of insulator).

To embed the chip 104 in the substrate 102, a cavity 110 is formed substrate 102. The cavity 110 is formed by a processing method, which depends on the material(s) forming the substrate 102. The cavity 110 is formed by, for example, etching, pressing, drilling, laser processing, or a combination thereof. The cavity 110 formed has length 112 and width 114 dimensions (FIG. 1A) that are larger than the chip 104 to be embedded. The height 116 (or thickness, FIG. 1B) of the cavity 110 is substantially the same as the height (or thickness) of the chip 104 in some embodiments so that the surface of the chip 104 once embedded is substantially flush with the surface of the substrate 102. Yet, in other embodiments, the height 116 (or thickness) of the cavity 110 is smaller than the height (or thickness) of the chip 104, and the gap filler 106 is disposed or layered to function as a ramp up to the chip 104. After forming the cavity 110 in the substrate 102, the chip 104 is inserted into the cavity 110. The chip 104 is also referred to as a die or electronic component. The chip 104 is a resistor or a capacitor.

The chip-embedded circuit board 100 includes a gap filler 106 in the gaps in the cavity 110 to form a gasket that seals the chip 104 in the substrate 102. The filler 106 is a thixotropic material. The chip embedded printed circuit board 100 further includes a plurality of interposers 108 printed on the gap filler 106 to provide an electrical connection between the chip 104 and the substrate 102. The interposers 108 include, for example, silver.

Figure 2:
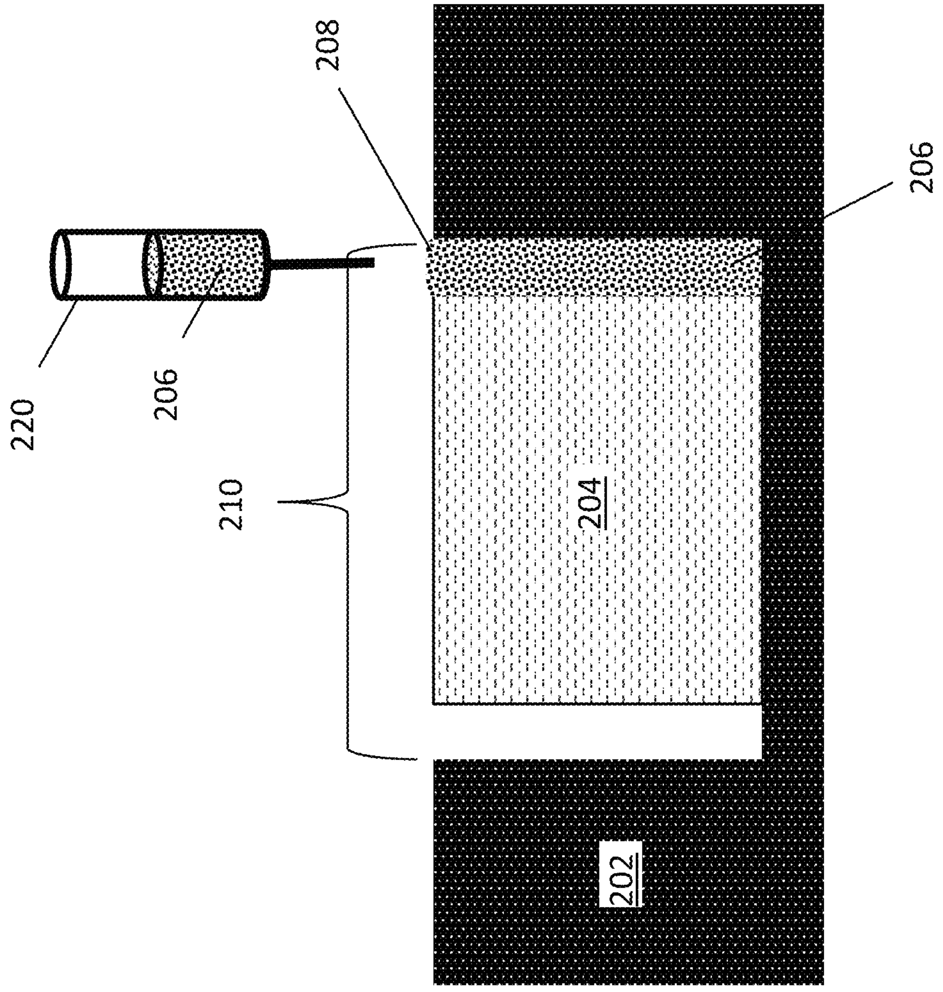
FIG. 2 is a cross-sectional side view of a method of using a gap filler to embed a chip in a printed circuit board.

FIG. 2 is a cross-sectional side view illustrating a method of embedding a chip 204 in a printed circuit board 202. The method includes forming a cavity 210 in the printed circuit board 202 and placing the chip 204 in the cavity in the printed circuit board 202. The method further includes disposing the gap filler 206 in a gap in the cavity 210 to seal the chip 204 in the cavity of the printed circuit board 202.

The method further includes forming interposers 208 on the gap filler 206 to provide an electrical connection between the chip 204 and the printed circuit board 202.

The gap filler 206 is injected, by a syringe 220 in some embodiments, into the gaps around the chip 204. Any method can be used to dispose the gap filler 206 in the cavity 210. Ultraviolet light is applied to the gap filler to cure the composition. Subsequently, heat is applied to further cure the composition. According to one or more embodiments, UV light is applied for a time, e.g., about 2 to about 4 minutes, and then heat is applied for a time, e.g., about 90 to about 150 minutes. The time for each curing step depends on many factors, including the monomers used, the combination of initiators, and the particular application.

The thixotropic property of the gap filler 206 means that the shear thinning is time dependent. The gap filler 206 is thick or viscous under static conditions or low shear but become less viscous and will flow when shear stressed. In some embodiments, the viscosity of the gap filler 206 at a shear rate of 5 $s^{-1}$ is greater than the viscosity of the gap filler 206 at a shear rate of 50 $s^{-1}$. According to one or more embodiments, the gap filler 206 has a viscosity of about 10,000 to about 50,000 cps at a shear rate of 5 $s^{-1}$, and a viscosity of about 1,000 to about 10,000 at a shear rate of 50 $s^{-1}$. According to other embodiments, the gap filler 206 has a viscosity of about 15,000 to about 30,000 cps at a shear rate of 5 $s^{-1}$, and a viscosity of about 2,500 to about 7,500 at a shear rate of 50 $s^{-1}$.

The dynamic viscosity of the filler 206 makes it an ideal electronic gap filler to embed a chip in a printed circuit board because it can simultaneously be subject to shear stress to flow into gaps between the chip and the printed circuit board and provide a surface that is smooth. The content of ceramic particles (e.g., boron nitride) provide the filler with a strong thixotropic effect. The thixotropic shear thinning effect allows the filler to drop in viscosity when shear is applied to force it out of the syringe, then return to a high viscosity when shear is removed, leaving behind a smooth pattern with high resolution. In contrast, commercially available electronic fillers have surfaces that have unfavorably high viscosity, which results in a rough finish that cannot be printed on top of, or unfavorably low viscosities, with minimal shear thinning that result in capillary wetting on the sidewalls of the junction as well as loss at gaps at the base of the device. In addition to the above gap filling applications, the dynamic viscosity properties of the fillers described herein make them suitable for other electronic applications, including any gap filling electronic applications or other electronic applications where the dielectric materials are needed to provide a ramp or elevated surface.

Also described herein are methods of screening initiator combinations for curing polymers. As the thermal and UV initiators may interact and reduce the reactivity of one another, assays were developed to assess the reactivities of various combinations of UV and thermal initiators. A photo-DSC assay measures the reactivity of the UV initiators in the presence of various thermal initiators. Following incubation for a period of time at a target temperature (e.g., 40 degrees Celsius for 1-minute), uncured gap filler material is exposed to UV radiation for a period of time (e.g., 3-minutes). Enthalpy (Watts per gram) is measured as a function of time (minutes).

Control photo-DSC spectra are first measured, which include a monomer with a single initiator, e.g., a UV initiator alone or a thermal initiator alone. The enthalpy measured illustrates bond formation between the monomers, i.e., polymerization, induced by the single initiator. The area under the curve is measured to determine the reaction enthalpy.

Then photo-DSC spectra are measured for a monomer combined with two initiators, e.g., a UV initiator and a thermal initiator. The resulting enthalpy again illustrates bond formation between the monomers, i.e., polymerization, induced by the combination of initiators. The area under the curved is measured to determine the reaction enthalpy.

The measured reaction enthalpy with the single initiator is compared to the measured reaction enthalpy with the combination of initiators. Then it is determined whether the reaction enthalpies are similar or dissimilar. When they are similar, there is a minimal inhibitory interaction between the initiators towards monomer conversion, which is a favorable result. However, when the reaction enthalpies are not similar, and the sample with the combination of inhibitors is lower than the control, there is an inhibitory interaction between the initiators, which is disfavored.

According to one or more embodiments, methods of screening initiator combinations include providing a first composition comprising an oxirane monomer in liquid form and a single initiator, the single initiator being an ultraviolet initiator. The method includes exposing the first composition to ultraviolet light at a wavelength absorbed by the ultraviolet initiator to initiate polymerization of a first polymer. The method further includes measuring enthalpy released by the polymer formed by the first composition. The method further includes providing a second composition comprising an oxirane monomer in liquid form, the ultraviolet initiator, and a thermal initiator. The method includes exposing the second composition to ultraviolet light at the wavelength absorbed by the ultraviolet initiator to initiate polymerization of a first polymer. The method further includes measuring enthalpy released by the second polymer formed by the second composition. The method then includes comparing the enthalpy of the first polymer to the enthalpy of the second polymer, and determining, based on the comparison, whether the UV initiator and the thermal initiator inhibit one another.

In some embodiments, the method further includes incubating the compositions at a temperature of about 30 degrees Celsius to about 50 degrees Celsius prior to exposing the compositions to ultraviolet light. In other embodiments, the method further includes exposing the composition to ultraviolet light for about 3 minutes to about 5 minutes.

EXAMPLES

Example 1: Photo-DSC and DSC Assays of UV and Thermal Initiator Combinations As the thermal and UV initiators may interact and reduce the reactivity of one another, assays were conducted to assess the reactivities of various combinations of UV and thermal initiators.

Figure 3A:
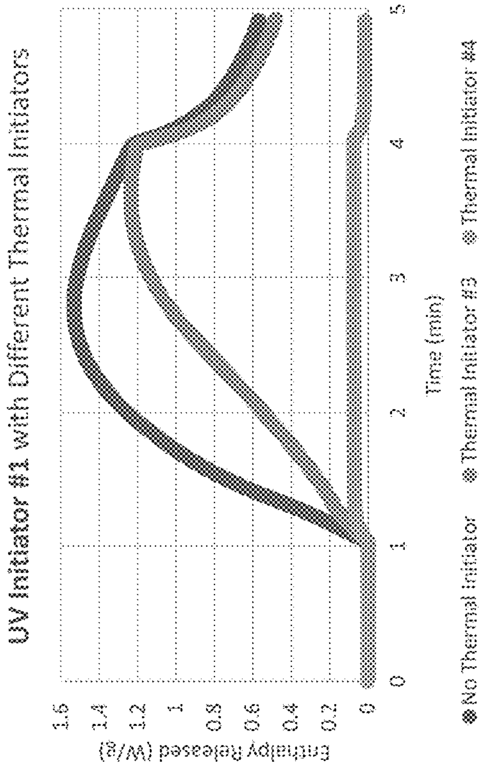
FIG. 3A is a photo differential scanning calorimetric (phot-DSC) spectrum of a gap filler after ultraviolet (UV) light curing with UV initiator #1 in combination with different thermal initiators.

Photo-DSC was used to measure the reactivity of the UV initiators in the presence of various thermal initiators. Following incubation at 40 degrees Celsius for 1-minute, uncured gap filler material was exposed to UVA radiation for 3-minutes. FIG. 3A is a photo-DSC spectrum of a gap filler material after ultraviolet UV light curing with UV initiator #1 in combination with thermal initiators #3 and #4.

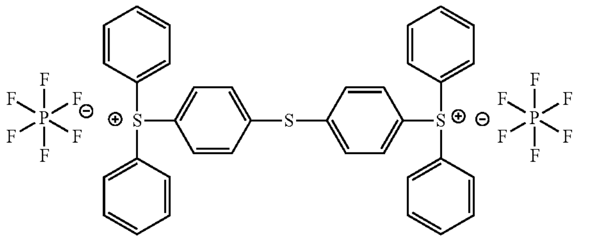

UV Initiator #1

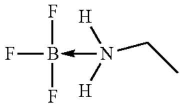

Thermal Initiator #3

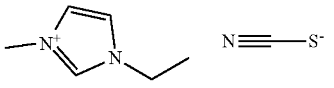

Thermal Initiator #4

Figure 3B:
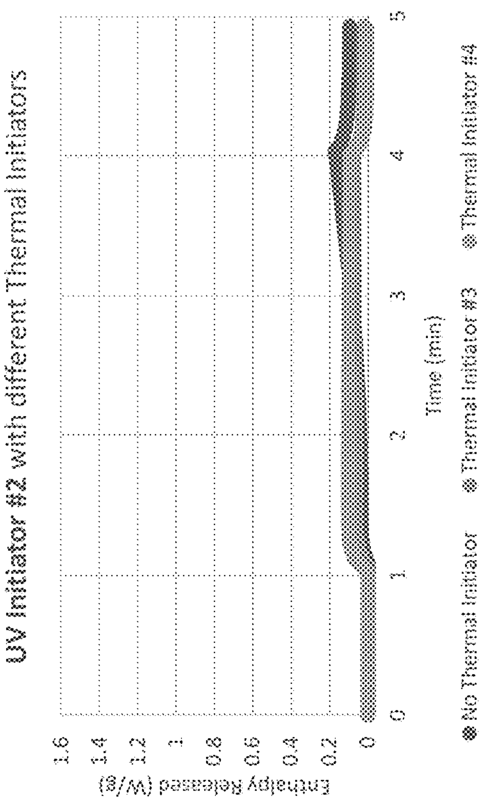
FIG. 3B is a photo differential scanning calorimetric (phot-DSC) spectrum of a gap filler after ultraviolet (UV) light curing with UV initiator #2 in combination with different thermal initiators.

FIG. 3B is a photo-DSC spectrum of a gap filler material after UV light curing with the UV initiator #2 (below) in combination with thermal initiators #3 and #4 (above).

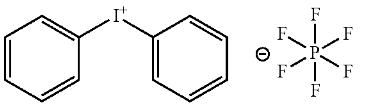

UV Initiator #2

Enthalpy (Watts per gram) was measured as a function of time (minutes). As shown FIGS. 3A and 3B. The combination of UV initiator #1 and thermal initiator #3 demonstrated the largest enthalpy release, which was consistent with the largest degree of polymerization for this combination.

Figure 3C:
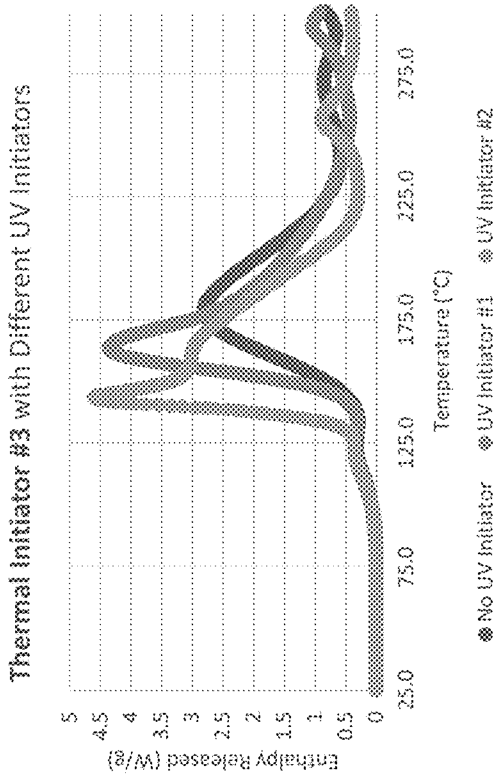
FIG. 3C is a differential scanning calorimetric (DSC) spectrum of a gap filler after thermal curing with thermal initiator #3 in combination with different UV initiators.
Figure 3D:
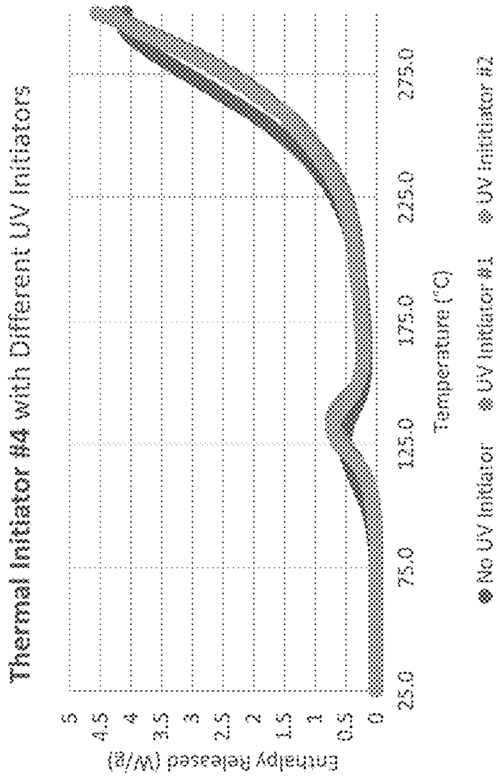
FIG. 3D is a differential scanning calorimetric (DSC) spectrum of a gap filler after thermal curing with thermal initiator #4 in combination with different UV initiators.

Conventional DSC was to measure the reactivity of the thermal initiators in the presence of various UV initiators. FIG. 3C is a differential scanning calorimetric (DSC) spectrum of a gap filler material after thermal curing with the thermal initiator #3 (above) in combination with UV initiators #1 and #2 (above). FIG. 3D is a differential scanning calorimetric (DSC) spectrum of a gap filler material after thermal curing with thermal initiator #4 in combination with UV initiators #1 and #2. Uncured material was tested up to a temperature of 300 degrees Celsius, with a temperature ramp of 20 degrees Celsius per minute. Enthalpy (Watts per gram) was measured as a function of temperature (degrees Celsius). As shown in FIGS. 3C and 3D, thermal initiator #1 provided the strongest enthalpy release with both UV initiators, which again is consistent with the largest degree of polymerization.

Example 2: DSC Assays of Monomers

Figure 4:
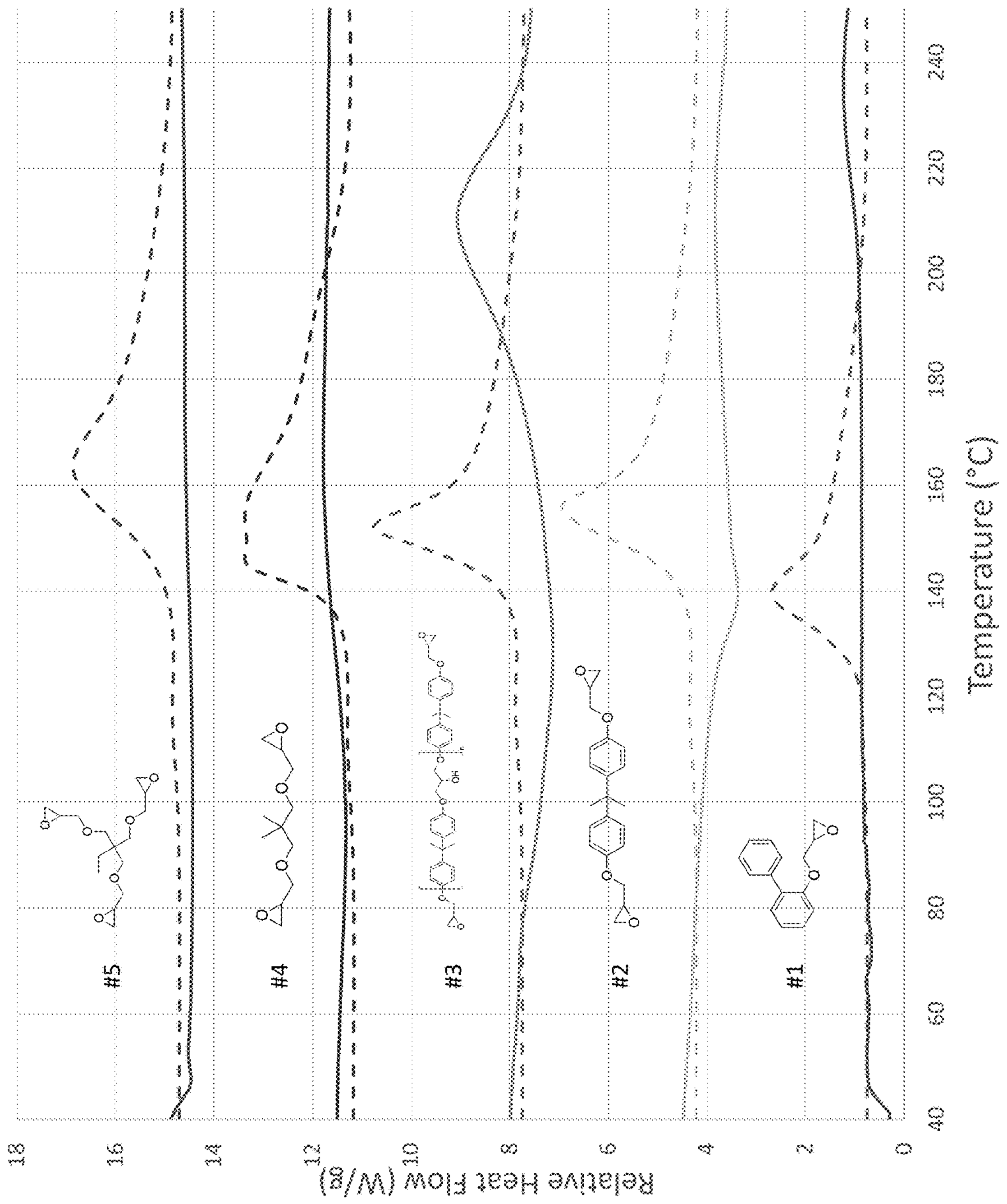
FIG. 4 shows differential scanning calorimetric (DSC) spectra of gap fillers with various monomers.

Using the combination of UV initiator #1 with thermal initiator #3, DSC was used to investigate the degree of curing and thermal events with different monomers. FIG. 4 shows DSC spectra of gap fillers with monomers #1-5. Relative heat flow (Watts per gram) was measured as a function of temperature (degrees Celsius) with a 20 degree per minute ramp to 300 degrees Celsius. The dotted traces illustrate each sample before curing, and the solid traces illustrate the samples after curing at 125 degrees Celsius for 16 hours. By measuring before and after curing, the residual enthalpy could be compared to the initial enthalpy, which illustrated the degree of cure (the amount of monomer which has reacted into polymer). As shown in FIG. 4, certain monomers showed a higher degree of cure then others. These monomers were then treated as preferred monomers moving forward because they monomers reacted to completion.

Example 3: FT-IR Assay of the Degree of Curing with Various Monomers

Figure 5:
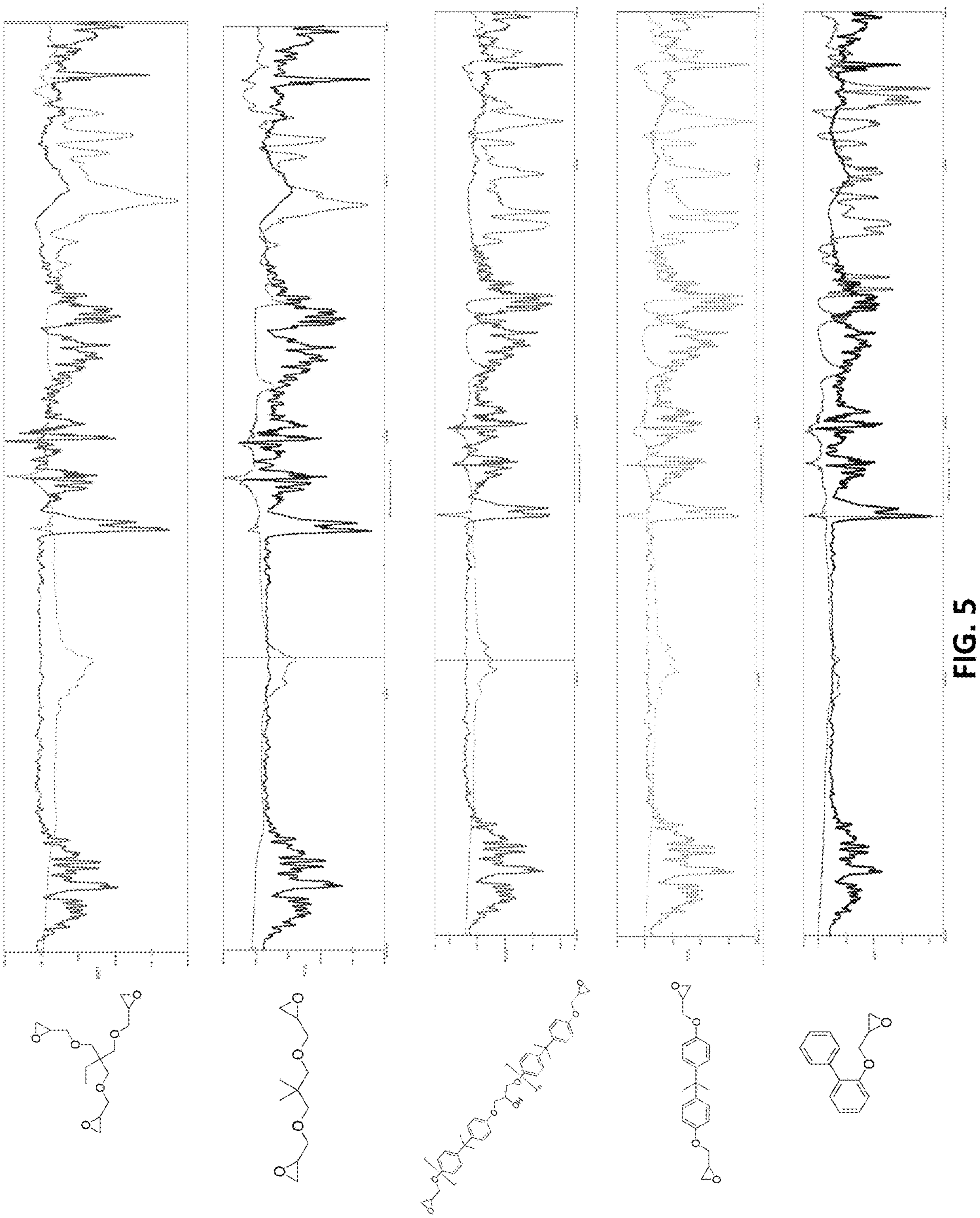
FIG. 5 shows Fourier transform infrared (FTIR) spectra of gap fillers with various monomers.

Fourier transform infrared (FT-IR) spectroscopy was used to study the degree of curing and thermal events with various monomers. FT-IR was run on each sample and after curing, as shown in FIG. 5, with the dotted trace showing the spectra before and the solid trace showing the spectra after curing. These spectra show unreacted oxirane group bands at 3000 $cm^{-1}$ in the uncured samples, and the hydroxide groups bands at 3750 $cm^{-1}$ in the cured material, which indicates targeted polymerization has occurred.

Example 4: CTE Assays with Ceramics

Figure 6:
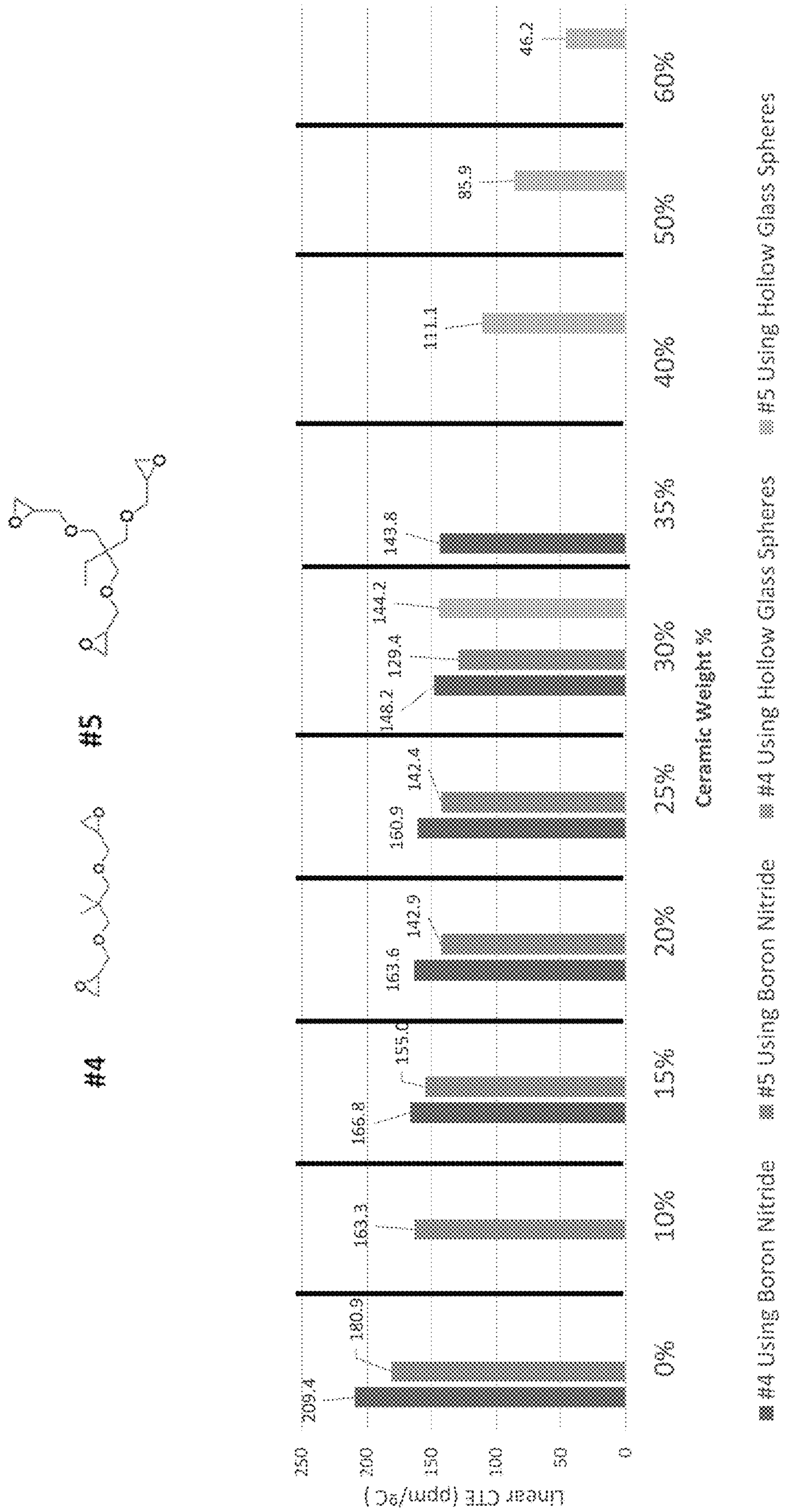
FIG. 6 shows coefficient of thermal expansion (CTE) of gap fillers with various amounts of boron nitride and glass sphere particles.

Various amounts of ceramics, including boron nitride and hollow glass spheres, were added to the gap filler compositions with the shown monomers, polymerized using the combination of UV initiator #1 with thermal initiator #3. Monomer #4 had a viscosity of 17 Centipoise. Monomer #5 had a viscosity of 150 Centipoise. FIG. 6 shows coefficient of thermal expansion (CTE) of gap fillers with various amounts of boron nitride and glass sphere particles. The linear CTE (parts per million per degrees Celsius) was measured as a function of ceramic weight percent. The ceramics were blended to match the CTE of a printed conductor. As shown in FIG. 6, by using increasing amounts of ceramic particles, the CTE of the composite as a whole decreased and approached that of printed conductor inks.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combinations" is inclusive of blends, mixtures, alloys, reaction products, and the like. The terms "first," "second," and the like, do not denote any order, quantity, or importance, but rather are used to distinguish one element from another. The terms "a" and "an" and "the" do not denote a limitation of quantity and are to be construed to cover both the singular and the plural, unless otherwise indicated herein or clearly contradicted by context. "Or" means "and/or" unless clearly stated otherwise. As used herein, the terms "comprising" "including," "having," "containing," "involving," and the like are to be understood to be open-ended, i.e., to mean "including" but not limited to, unless otherwise noted. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Reference throughout the specification to "an aspect", "an embodiment", and so forth, means that a particular element described in connection with the embodiment is included in at least one embodiment described herein, and may or may not be present in other embodiments. In addition, it is to be understood that the described elements may be combined in any suitable manner in the various embodiments. A "combination thereof" is open and includes any combination comprising at least one of the listed components or properties optionally together with a like or equivalent component or property.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A composition for making a filler comprising:
a plurality of ceramic particles having an aspect ratio of between 2:1 and 30:1;
an oxirane monomer in liquid form having a viscosity of less than 17 centerpoise;
an ultraviolet initiator that absorbs ultraviolet; and
a thermal initiator.

2. The composition of claim 1, wherein the plurality of ceramic particles are boron nitride particles.

3. The composition of claim 1, wherein the plurality of ceramic particles are glass spheres.

4. The composition of claim 1, wherein the ultraviolet initiator has the following structure:

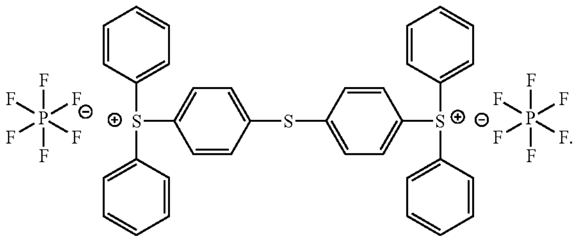

5. The composition of claim 4, wherein the thermal initiator has the following structure:

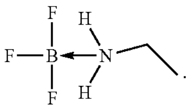

6. The composition of claim 5, wherein the monomer has the following structure:

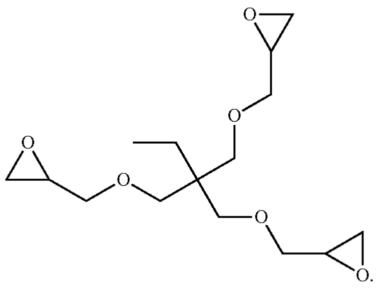 [SMILES: CCC(COCC1CO1)(COCC1CO1)COCC1CO1]

7. The composition of claim 1, wherein the composition does not include a solvent.

* * * * *